(12) United States Patent
Tanabe

(10) Patent No.: US 6,426,967 B1
(45) Date of Patent: Jul. 30, 2002

(54) SEMICONDUCTOR LASER DEVICE

(75) Inventor: Tetsuhiro Tanabe, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/344,648

(22) Filed: Jun. 25, 1999

(30) Foreign Application Priority Data

Jun. 29, 1998 (JP) .......................................... 10-181791

(51) Int. Cl.[7] ................................................. H01S 5/22
(52) U.S. Cl. ........................................ 372/46; 372/47
(58) Field of Search ............................................. 372/46

(56) References Cited

U.S. PATENT DOCUMENTS

| | | | | |
|---|---|---|---|---|
| 4,282,494 A | * | 8/1981 | Yonezu et al. ................. | 372/46 |
| 4,759,025 A | * | 7/1988 | Kamejima .................... | 372/46 |
| 5,539,239 A | * | 7/1996 | Kawazu et al. ................ | 257/94 |
| 5,805,628 A | * | 9/1998 | Karakida et al. .............. | 372/46 |
| 5,844,931 A | * | 12/1998 | Sagawa et al. ................ | 372/46 |
| 5,923,691 A | * | 7/1999 | Sato ............................ | 372/46 |
| 6,049,556 A | * | 4/2000 | Sato ............................ | 372/46 |

* cited by examiner

*Primary Examiner*—Paul Ip
*Assistant Examiner*—Jeffrey Zahn
(74) *Attorney, Agent, or Firm*—Hoffmann & Baron, LLP

(57) ABSTRACT

A semiconductor laser device includes a substrate formed of GaAs. A lower electrode is formed on an underside of this substrate. The substrate has, on its top surface, a lower cladding layer, an active layer, a first upper cladding layer, an etch stop layer, a current restricting layer, a second contact layer and an upper electrode formed in this order. A second upper cladding layer is formed widthwise centrally of the current restricting layer. A first contact layer and an insulation film are formed on the second upper cladding layer. This insulation film blocks a current from flowing from the upper electrode to an end of an optical waveguide. Accordingly, a current non-injection region is provided at an end of the active layer or optical waveguide.

5 Claims, 4 Drawing Sheets

SEMICONDUCTOR LASER DEVICE

BACKGROUND OF THE INVENTION

1. Field of the Invention

This invention relates to semiconductor laser devices and, more particularly, to a semiconductor laser device which is applicable for disc players, barcode readers, etc.

2. Description of the Prior Art

In general, the active layer includes an optical waveguide which at ends undergoes oxidation to have a band gap reduced smaller than that of a central position, resulting in absorption of laser light and rise in temperature. Due to this, catastrophic optical damage (hereinafter referred to as "COD") tends to occur more readily at the end portions of the optical waveguide than in a central position thereof. There is a fear that such COD might cause deterioration in characteristic of the semiconductor laser device.

In order to prevent this, it has been a conventional practice to adopt a method to allow laser light to permeate from an end portion of an optical waveguide into a cladding layer, thereby reducing the photon density therein. Furthermore, another method has also been utilized wherein zinc (Zn) is thermally diffused into the end portions of an optical waveguide thereby obtaining transparent regions (NAM structure). Thus the optical waveguide at its ends has been suppressed from being raised in temperature.

Of the above-mentioned prior arts, the method of lowering the photon density involves a problem that the emission efficiency of laser light be lowered. On the other hand, in the method of forming an NAM structure, there is difficulty in exactly controlling the Zn diffusion depth, thus resulting in instability of characteristic. Moreover, there has been a problem that the manufacture process becomes complicated by the necessity of such processes as forming a Zn-containing film, removing the same film, thermally diffusing Zn, and so on.

SUMMARY OF THE INVENTION

Therefore, it is a primary object of the present invention to provide a semiconductor laser device which can prevent COD without incurring reduction in tight emitting efficiency or complication in manufacture process.

A semiconductor laser device according to the present invention, including a lower cladding layer, an active layer having an optical waveguide, an upper cladding layer and an upper electrode which are overlaid a substrate, to inject an electric current from the upper electrode through the upper cladding layer into the active layer, comprises: a current non-injection region provided at an end portion of the active layer.

The current non-injection region can be provided by forming an insulation film on a contact layer in a position corresponding to an end portion of the active layer and between the upper electrode and the upper cladding layer. The insulation film may be typically formed of an insulation material, such as $SiO_2$, $Al_2O_3$, or $Ti_2O_3$. The insulation film, in concrete, can be formed by a organic metal chemical vapor deposition method.

The insulation film formed between the upper electrode and the upper cladding layer acts to block a leak current from flowing from the upper electrode to the end portion of the active layer. Accordingly, no current is injected to the end portion of the active layer, thereby providing a current non-injection region at the end portion. The current non-injection region at the end of the active layer is free from temperature rise due to Joule's heat and hence band gap decrease due to such temperature rise.

According to the present invention, no band gap decrease occurs at the end of the optical waveguide. Thus, it is possible to suppress against temperature rise due to laser light absorption and hence COD. Also, there is no necessity to permeate laser light into the cladding layer or to form a Zn-containing film. Hence, light emission efficiency is not lowered and manufacture process is not complicated.

The above described objects and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Figure 1A:
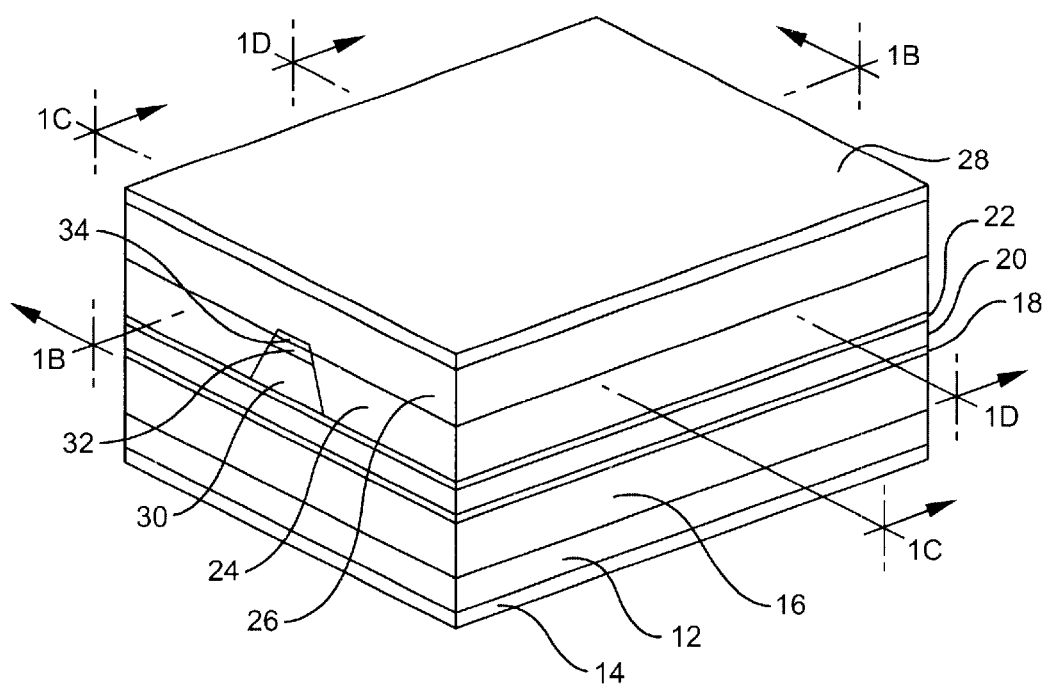
FIG. 1A–FIG. 1D are illustrative views showing one embodiment of the present invention.
Figure 1B:
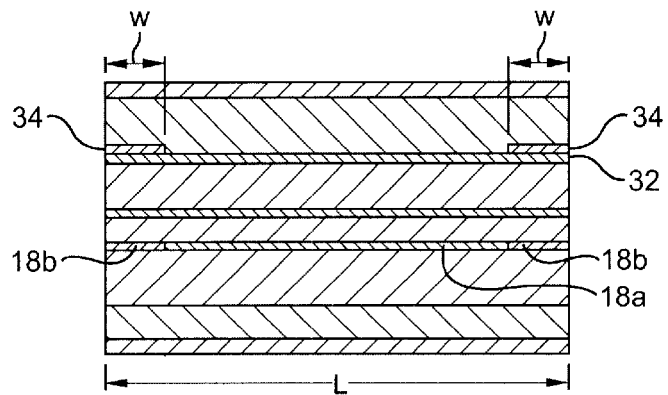
Figure 1C:
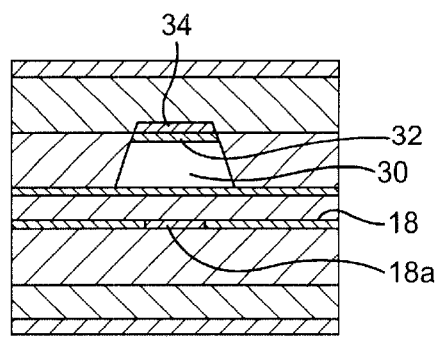
Figure 1D:
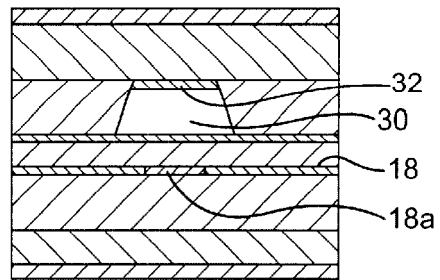

A semiconductor laser device 10 of this embodiment shown in FIG. 1 includes a substrate 12 formed of, say, GaAs in a first conductivity type ("n type" in the embodiment). On an underside of the substrate 12, a lower electrode 14 is formed based on Au.

On the other hand, on a top surface of the substrate 12 are formed a lower cladding layer 16 formed in an n type of, say, $In_x(Ga_{1-Y}Al_Y)_{1-X}P$ (X=0.5, Y=0.7); an active layer 18 formed of, say, $In_X(GaAl_Y)$ P (X=0.5, 0.0≦Y≦0.4); a first upper cladding layer 20 formed in a second conductivity type ("p type" in the embodiment) of, say, $In_X(GaA_Y)$ P (X=0.5, Y=0.7); an etch stop layer 22 formed in a p type of, say, $In_X$GaP (X=0.5); a current restricting layer 24 formed in an n type of, say, GaAs; and a second contact layer 26 formed in a p type of, say, GaAs, in this order. An upper electrode 28 is formed based on Au on a top surface of the second contact layer 26.

Meanwhile, a p-type second upper cladding layer 30 is formed of, say, $In_X(GaAl_Y)$ P (X=0.5, Y=0.7) widthwise centrally of the current restricting layer 24 so that it extends in a direction of laser emission from one end to the other end. The second upper cladding layer 30 has a p-type first contact layer 32 formed of, say, $In_X$GaP (X=0.5) thereon.

Furthermore, insulation films 34 are formed of $SiO_2$, $Al_2O_3$, $Ti_2O_3$ or the like on the first contact layer 32 in a manner covering opposite ends thereof.

Accordingly, an optical waveguide 18a (black portion in FIG. 1C or FIG. 1D) is given as a corresponding portion of the active layer 18 to the second upper cladding layer 30 to produce laser light and guide it therein. Current non-injection regions 18b (black portion in FIG. 1B) are provided also in the active layer 18 at portions corresponding to the respective insulation films 34. That is, the provision of insulation layers 34 on the first contact layer 32 provides current non-injection regions 18b at respective ends of the active layer 18. Here, the insulation film 34 is in such a size that the current non-injection region 18b is positively provided at the end of the optical waveguide 18a. For example, where the optical waveguide 18a has a length L of approximately 500–1000 μm, the width W for the insulation film 34 is given approximately 40 μm.

Figure 2A:
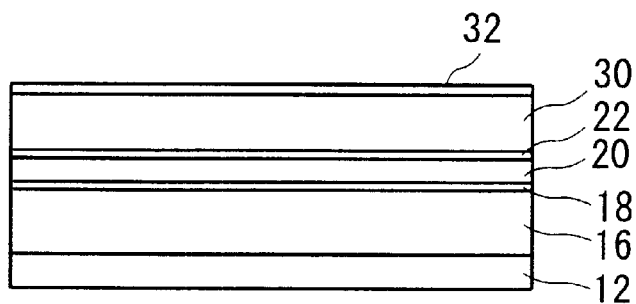
FIG. 2A–FIG. 2G are illustrative views showing in a process order a manufacturing method of this embodiment.

Explanation will be made hereunder on a method for concretely manufacturing a semiconductor laser device, according to FIG. 2A to FIG. 2G. As shown in FIG. 2A, a substrate 12 is first placed within a Metal Organic Chemical Vapor Deposition (hereinafter referred to as "MOCVD") apparatus. On the substrate 12 are formed a lower cladding layer 16 to a thickness of 12000–18000 Å, an active layer 18 to 800–1200 Å, a first upper cladding to 2500–3500 Å, an etch stop layer 22 to 100–500 Å, a second upper cladding layer 30 to 10000–14000 Å, and a first contact layer 32 to 100–500 Å, in this order.

Figure 2B:
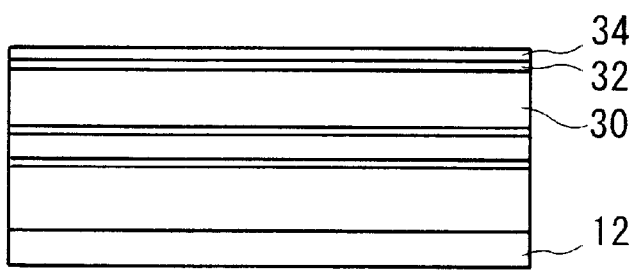

The substrate 12 is taken out of the MOCVD apparatus and then inserted in a sputter apparatus. An insulation film 34 is formed by a sputter method on the first contact layer 32, as shown in FIG. 2B.

Figure 2C:
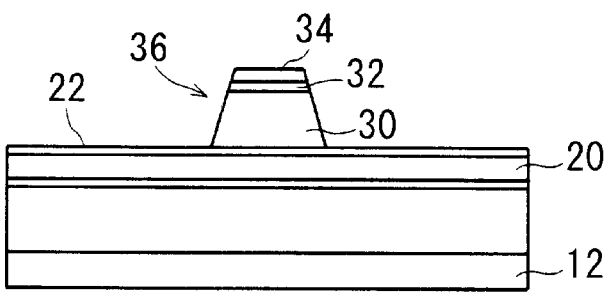

After taking the substrate 12 out of the sputter apparatus, the insulation film 34 is masked with not-shown photoresist. Etching is then made on the insulation film 34, the first contact layer 32 and the second upper cladding layer 30 to thereby form a structure 36 in a ridge form, as shown in FIG. 2C. At this time, the etch stop layer 22 acts to hinder the etching from being put forward further. Consequently, there is no possibility that the first upper cladding layer 20 be etched undesirably. Incidentally, in this etching process, it is possible to separately etch the insulation film 34, the first conduct layer 32 and the second upper cladding layer 30 by using different kinds of etch solutions or gasses. Also, it is possible to etch on two or all of them continuously by using a same kind of etch solution or gas.

Figure 2D:
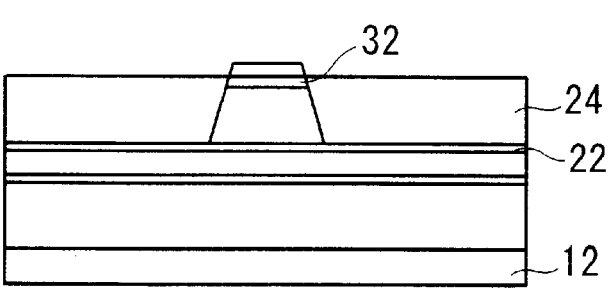

After removing the not-shown photoresist from the insulation film 34, the substrate 12 is placed within the MOCVD apparatus. As shown in FIG. 2D, a current restricting layer 24 is grown on the etch stop layer 22 to a top surface height of the first contact layer 32.

Figure 2E:
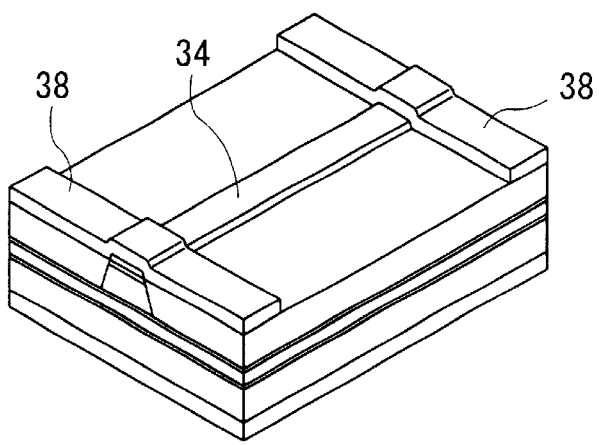
Figure 2F:
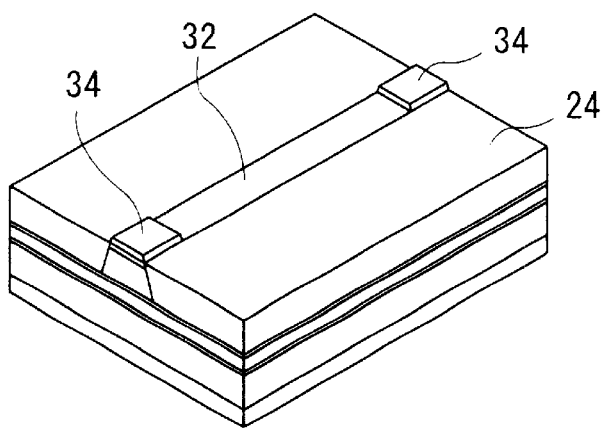

After taking the substrate 12 out of the MOCVD apparatus, the insulation film 34 is masked at its opposite ends with photoresist 38, and the insulation film 34 is etched to remove an unwanted portion, as shown in FIG. 2E. Then, the photoresist 38 is removed away, thus obtaining insulation films 34 in a predetermined size as shown in FIG. 2F.

Figure 2G:
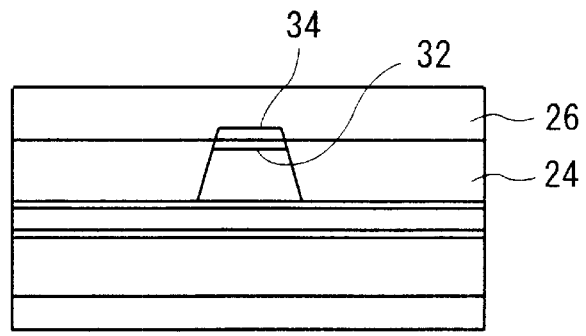

Subsequently, the substrate 12 is placed within the MOCVD apparatus. As shown in FIG. 2G, a second contact layer 26 is formed to a thickness of 8000–12000 Å over the current restricting layer 24, first contact layer 32 and insulation film 34.

After taking the substrate 12 from the MOCVD apparatus, a lower electrode 14 is formed by evaporation or the like on an underside of the substrate 12 as shown in FIG. 1. An upper electrode 28 is formed by evaporation or the like on a top surface of the second contact layer.

In this semiconductor laser apparatus 10, if a voltage is applied to between the lower electrode 14 and the upper electrode 28, an electric current is caused to flow from the upper electrode 28 to the active layer 18 through the second contact layer 26, first contact layer 32, second upper cladding layer 30, etch stop layer 22 and first upper cladding layer 20. Thus laser light is created within the optical waveguide 18a of the active layer 18. At this time, because the current directed toward the end of the optical waveguide 18a is blocked by the insulation layer 34, a current non-injection region 18b is provided at the end of the optical waveguide 18a. Accordingly, at the end of the optical waveguide 18a no Joule's heat is produced. This suppresses the reduction in band gap due to temperature rise and laser light absorption.

According to this embodiment, the optical waveguide 18a can be suppressed at ends from being raised in temperature due to absorption of laser light, and is thus prevented from undergoing COD. Also, there is no necessity to permeate laser light into the cladding layer 16 or 20 or diffuse Zn into the optical waveguide 18a. There is also no possibility of encountering a reduction in light emitting efficiency or a complicated manufacturing process as in conventional processes.

Incidentally, in the above embodiment the compound layers were formed by using the MOCVD apparatus. Alternatively, the compound layers may be formed using, for instance, a Molecular Beam Epitaxial growth (MBE) apparatus.

Also, in the embodiment, the insulation layers were formed on the first contact layer to block the electric current to the active layer ends, thereby providing current non-injection regions at the active layer ends. However, the means for blocking a current to the active layer can be formed in an arbitrary position between the upper electrode 28 and the second upper cladding layer 30.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor laser device, including a lower cladding layer, an active layer having an optical waveguide, an upper cladding layer and an upper electrode which are overlaid on a substrate, to inject an electric current from said upper electrode through said upper cladding layer into said active layer, comprising:

a current non-injection region provided at an end portion of said active layer, said current non-injection region being provided by forming a current blocking portion between said upper electrode and said upper cladding layer in order to block an electric current from being injected into said end portion of said active layer.

2. A semiconductor laser device according to claim 1, wherein said current blocking portion includes an insulation layer.

3. A semiconductor laser device according to claim 2, further comprising a contact layer formed on said upper cladding layer, wherein said insulation layer is formed on said contact layer.

4. A semiconductor laser device according to claim 2, wherein said insulation layer includes an oxide film.

5. A semiconductor laser device according to claim 4, wherein said oxide film include $SiO_2$.

* * * * *